United States Patent [19]
MacDonald et al.

[11] Patent Number: 5,606,569
[45] Date of Patent: Feb. 25, 1997

[54] ERROR CORRECTING DECODER AND DECODING METHOD FOR RECEIVERS IN DIGITAL CELLULAR COMMUNICATION SYSTEMS

[75] Inventors: Andrew J. MacDonald, Damascus; Stanley E. Kay, Rockville, both of Md.

[73] Assignee: Hughes Electronics, Los Angeles, Calif.

[21] Appl. No.: 601,890

[22] Filed: Feb. 15, 1996

Related U.S. Application Data

[63] Continuation of Ser. No. 8,431, Jan. 25, 1993, abandoned.
[51] Int. Cl.$^6$ .......................... H03M 13/00; H03M 13/12
[52] U.S. Cl. ............................................. 371/37.7; 371/43
[58] Field of Search ................................. 371/37.4, 37.7, 371/43

[56] References Cited

U.S. PATENT DOCUMENTS

| | | | |
|---|---|---|---|
| 4,807,253 | 2/1989 | Hagenauer et al. | 375/57 |
| 4,882,733 | 11/1989 | Tanner | 371/43 |
| 5,010,554 | 4/1991 | Bechtel et al. | 371/37.1 |
| 5,068,857 | 11/1991 | Yoshida | 371/37.7 |
| 5,208,816 | 5/1993 | Seshardi et al. | 371/43 |
| 5,307,377 | 4/1994 | Chouly et al. | 375/39 |
| 5,349,589 | 9/1994 | Chennakeshu et al. | 371/43 |

FOREIGN PATENT DOCUMENTS

| | | |
|---|---|---|
| 0415502A2 | 6/1991 | European Pat. Off. |
| 94850013 | 12/1994 | European Pat. Off. |
| 2238933 | 12/1991 | United Kingdom |

OTHER PUBLICATIONS

Wang, Q. et al., "An Efficient Maximum Likelihood Decoding Algorithm . . . ", IEEE Trans. on Communications, vol. 37, No. 8, Aug. 1989, pp. 875–879.

John G. Proakis, Digital Communications, 1989, pp. 376–377, 440–443.

W. Wesley Peterson, E. J. Weldon, Jr., Error–Correcting Codes, 1972, pp. 1–19.

INSPEC–AN 3741524 Generalized Viterbi Algorithms for Error Detection with Convolutional Codes, N. Seshardi and C. E. W Sunberg AT& T Bell Laboratories, Murray Hills, New Jersey 07974.

INSPEC–AN 1208045 A Concatenated Coding Approach for High Data Rate Applications Robert W. Boyd, J. Bigg Cain & George C. Clark, Jr. Harris Electronic Systems Division, Melbourne, FL 32901.

INSPEC–AN 3327666 Comparison between Different Soft Decoding Algorithms Jan Nilsson, & Istvan Kerekes, Department of Electrical Engineering Linkoping University, Sweden.

INSPEC–AN 3561604 Maximum Likelihood Soft Decoding of Binary Block Codes and Decoders for the Golay Codes, Jakov Snyders & Yair Be'ery 8097 IEEE Transactions on Information Theory 35(1989)Sep., No. 5, New York, US.

INSPEC–AN 344182 A Class of Algorithms for Decoding Block Codes with Channel Measurement Information, David Chase IEEE Transactions on Information Theory, vol. IT–18, No. 1, Jan. 1972.

INSPEC–AN 3374506 Soft Decision Decoding of Block Codes Using Received Signal Envelope in Digital Mobile Radio, Tadashi Matsumoto 8272 IEEE Journal of Selected Areas in Communications 7(1989)Jan., No. 1, New York, US.

(List continued on next page.)

*Primary Examiner*—Stephen M. Baker
*Attorney, Agent, or Firm*—Gordon R. Lindeen, III; Wanda K. Denson-Low

[57] ABSTRACT

A cellular base station receiver uses a digital signal processor to decode receiver code words in an inner Reed-Solomon code. A list of code word estimates is generated by making different symbol erasure combinations. An outer cyclic redundancy code operates as an error detector for the word estimates. When a code word estimate is found to be error-free, it is accepted for output.

22 Claims, 7 Drawing Sheets

OTHER PUBLICATIONS

INSPEC–AN 4474432 Successive=Erasure Decoding of RS–Coded MPSK Schemes in a Rayleigh Fading Channel, S. Hamidreza Jamali and Tho Le–Ngoc 0–7803–0608–Feb. 1992, 1992 IEEE.

Soft Decision Decoding of Block Codes and Concatenated Block–Convolutional Codes Using the Stack Algorithm Elke Offer and Michael . Perkins 1991 IEEE, CH2980–1/91/0000–0765.

INSPEC–AN 4160194 High Performance Coder: A Possible Candidate for the GSM Half–Rate System Yuhang Wu, Henrik B. Hansen, Knud J. Larsen, Henrik Nielsen and John Aa. Sorensen CH2977–7/91/0000–0613, 1991 IEEE.

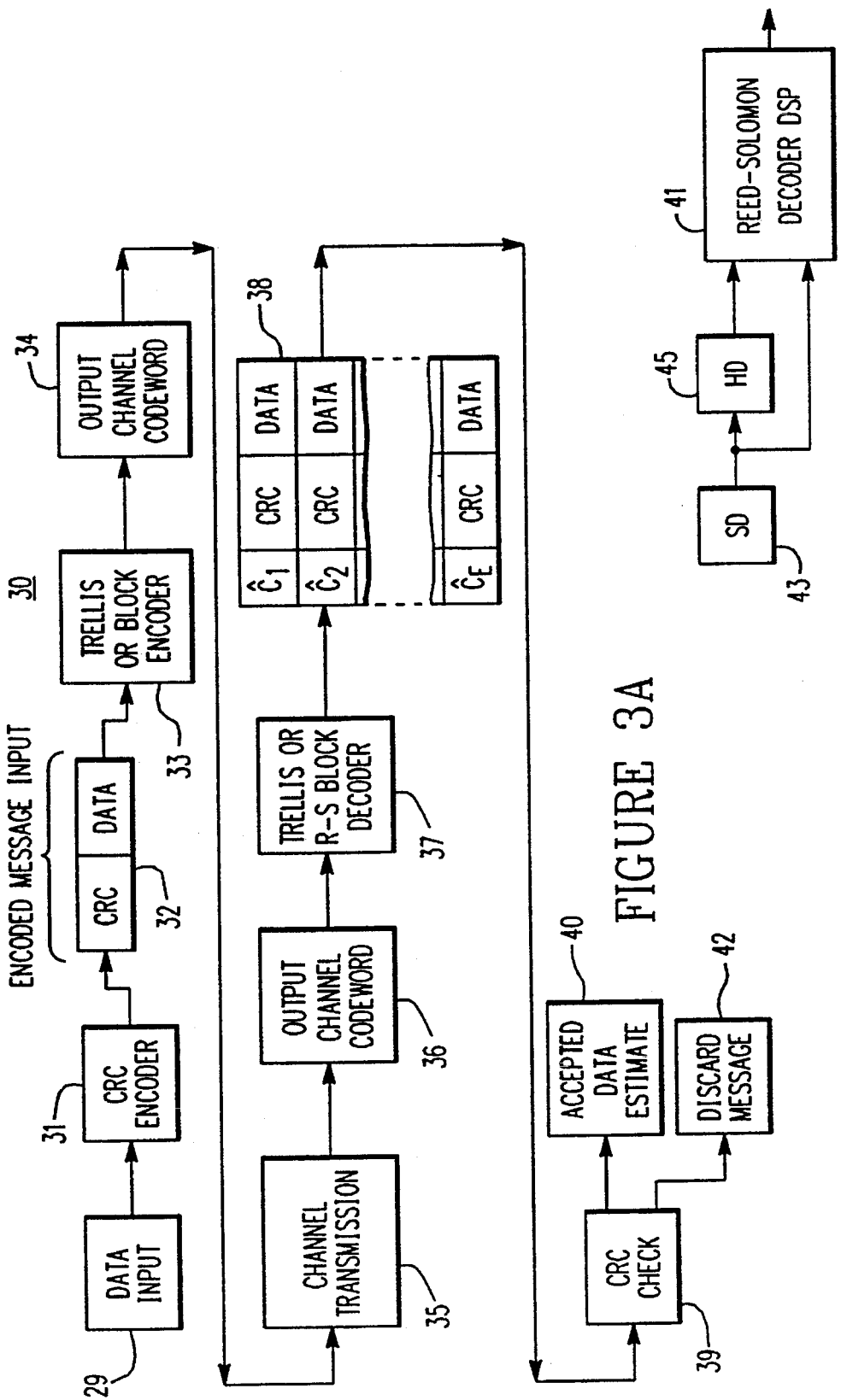

ERROR CORRECTING DECODER AND DECODING METHOD FOR RECEIVERS IN DIGITAL CELLULAR COMMUNICATION SYSTEMS

This is a continuation of application Ser. No. 08/008,431 filed Jan. 25, 1993 now abandoned.

BACKGROUND OF THE INVENTION

The present invention relates to digital cellular communication systems and more particularly to error correcting decoders employed in digital cellular base stations and mobile phones.

In cellular communication systems, encoding/decoding procedures are applied to transmitted voice and other data to reduce data errors. Prior to transmission from a mobile phone or from a base station, encoding is usually performed with either a block coding scheme or a trellis coding scheme.

In the prior art, the most common cellular system procedure for encoding messages at the sending end of the system is a two step procedure in which a message is first encoded using a cyclic redundancy code (CRC) as an outer code and then encoded using a trellis or block code as an inner code. At the receiving end of the cellular system, the message is decoded using the inner loop code to eliminate as many errors as possible through forward error correction (FEC).

The message is then decoded using the outer CRC code to detect whether any message errors still exist. The message is discarded if any error is detected. In this prior art approach, a message is successfully decoded if a maximum of $$\frac{n-k}{2}$$

errors exist in unknown word locations.

The most common block coding scheme is the Reed-Solomon scheme which is best adapted for correcting burst data errors such as those that often occur in cellular communication channels as a result of Rayleigh fading. Trellis encoding is most commonly implemented by means of a convolutional scheme, and is best adapted for correcting random data errors. Each of these schemes has been variously embodied to limit data transmission errors in cellular communication systems.

To provide for error correction and detection in the Reed-Solomon scheme, data in a word to be transmitted is first encoded in an outer code commonly by a CRC encoder which generates CRC error detection bits. Parity bits are also generated to provide FEC in accordance with the Reed-Solomon procedure. The CRC and FEC bits are combined with the data bits in the word to be transmitted, such as from a mobile unit.

The received word is checked to determine whether the data bits received are the same as the data bits transmitted. For this purpose, the received word data is first passed through a Reed-Solomon decoder where FEC is applied. The Reed-Solomon output is then passed through a CRC encoder.

The resulting CRC code bits and the received CRC code bits are compared. If the compared CRC bits are the same, the data is accepted as valid. If a difference is detected, the received data is discarded as erroneous. Generally, a CRC encoder having a longer CRC code provides better error protection by making it less likely that a data error will go undetected.

Prior art decoders, employing Reed-Solomon or other block or trellis codes, have been limited in error protection performance as a result of limited error correcting capability. In addition, the amount of computer capacity required for implementation of the Reed-Solomon or other coding procedures respectively in prior art decoders has limited cost effectiveness and the cost/benefit ratio in providing error protection in cellular communication products.

SUMMARY OF THE INVENTION

The present invention is directed to a digital cellular communication system and method in which error correction decoding is performed with better error correcting capability and with greater product cost effectiveness.

A cellular receiver in a cellular communication system comprises means for receiving and demodulating a transmitted signal representing a code word containing a message encoded with an error detecting code as an outer code and enclosed with an error correcting code as an inner code. Means are provided for decoding the demodulated signal including means for generating a list of estimates of the code word from the demodulated signal and means for operating an error correcting decoder with the error correcting code to decode estimates of the code word. The decoding means further includes means for operating an error detector decoder with the error detecting code to process decoded code word estimates and determine whether an error exists in each decoded code word estimate that is processed, means for generating as an output signal any decoded code word estimate detected to be error-free, and means for generating a code word error if no decoded code word estimate is detected to be error-free.

BRIEF DESCRIPTION OF THE DRAWINGS

The accompanying drawings, which are incorporated in and constitute a part of this specification, illustrate a preferred embodiment of the invention and together with the description provide an explanation of the objects, advantages and principles of the invention. In the drawings:

FIG. 3A provides an overview functional flow diagram for a cellular communication system operated in accordance with the present invention;

FIG. 3B illustrates a Reed-Solomon decoder employed in the base station circuitry of FIG. 2 in accordance with the present invention;

DESCRIPTION OF THE INVENTION

Figure 1:
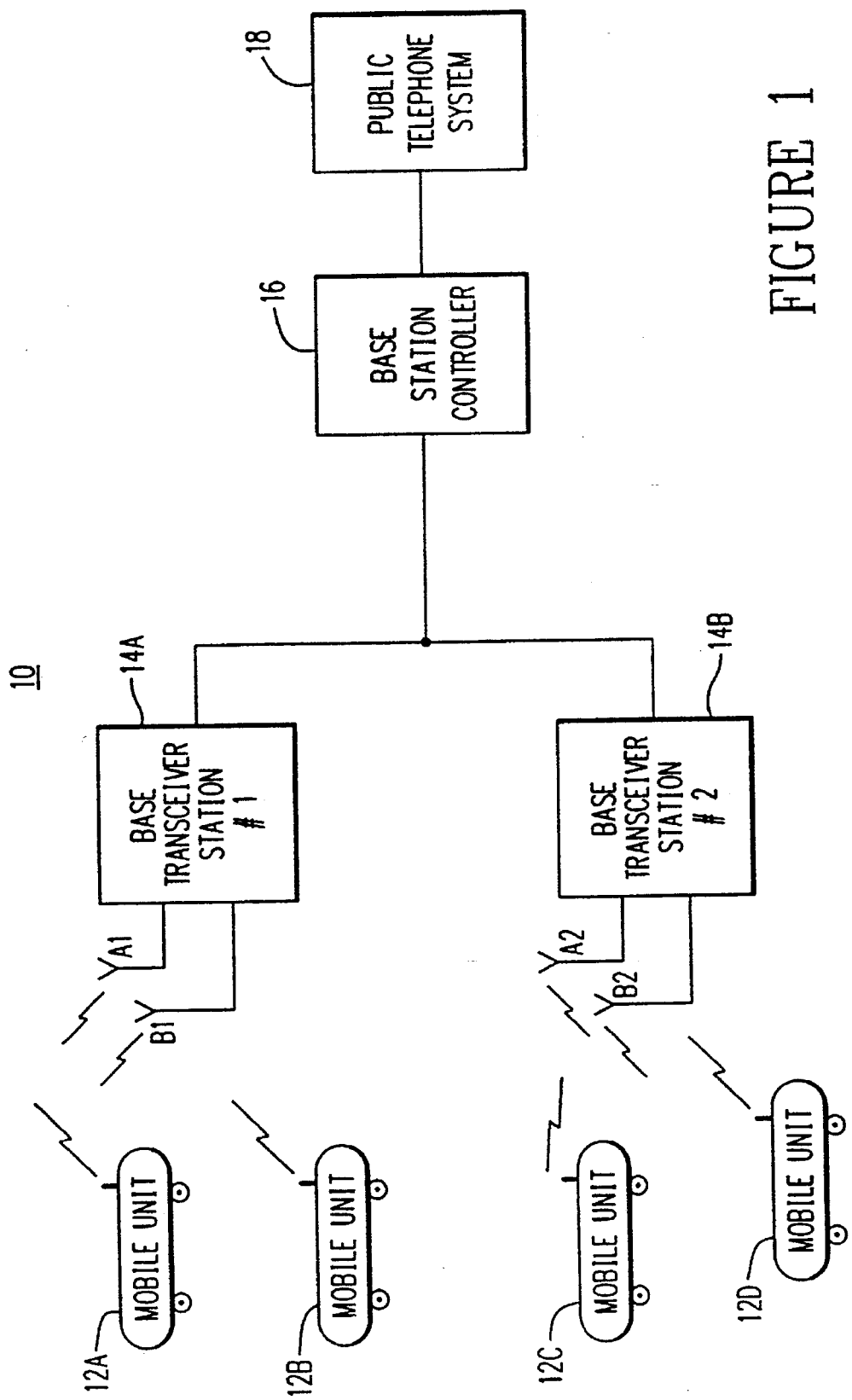
FIG. 1 shows a block diagram for a digital cellular communication system in which the present invention is embodied in its preferred form.

A digital cellular communication system 10 is shown in FIG. 1 in which a preferred form of the present invention is embodied. The system 10 is operative in a defined geographic region such as all or part of a metropolitan area.

The cellular system 10 includes numerous mobile phone units, as represented by four illustrated units 12A through 12D. Communication links may be established between the mobile units 12A–12D and a base station for the communication cell within which the mobile unit(s) may be located. In this illustrative case two base stations 14A and 14B are shown.

Respective pairs of diversity antennae A1, B1 and A2, B2 are provided at the base stations to provide for receiving diversity signals from a transmitting mobile unit. In the preferred embodiment, the diversity signals are processed to remove errors and develop high quality demodulated voice signals in accordance with the invention.

A base station controller 16 provides system management functions through regulation of the operation of the base stations 14A and 14B and by establishing communication links with a public telephone system 18.

Figure 2:
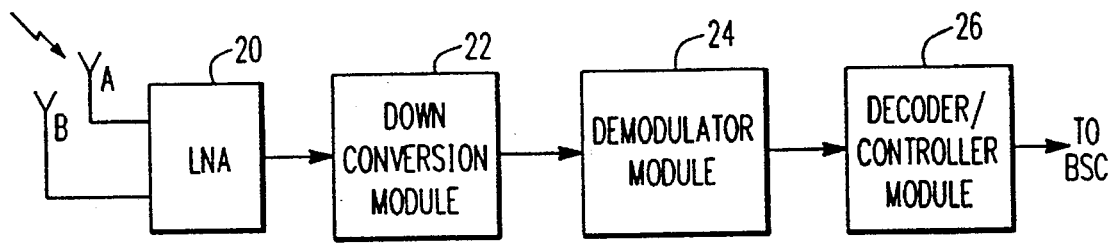
FIG. 2 shows a subsystem block diagram for base station circuitry employed in the system of FIG. 1.

As shown in FIG. 2, circuitry for the base station 14A or 14B includes an RF receiver having a low noise amplifier 20 that receives signals from diversity antennae A and B. Next, a down-conversion module 22 provides signal downconversion from RF to the baseband and then provides analog-to-digital conversion through a signal sampling procedure.

The output digital signal from the downconversion module 22 is applied to a demodulator means or a demodulator module 24 where the originally modulated signal is demodulated. The originally transmitted signal is modulated using π/4, shifted differential encoded quadrature phase shift keying.

The demodulator means 24 is structured in accordance with the present invention to provide improved base station demodulation in the sense that superior, relatively complex demodulation algorithms are enabled to be implemented cost effectively in real time with state-of-the-art processor hardware. As a result, cellular base station products can be manufactured and supplied to the market at competitive prices and simultaneously provide superior demodulation performance, higher quality voice channels, and extended system communication coverage and user capacity.

The base-station demodulator means 24 can be employed in various kinds of digital cellular communication systems, such as the conventional time division multiple access system. Further, the present invention can also be applied to mobile phone unit receivers to provide improved demodulation in the phone units in a manner similar to that described herein for base stations.

The output of the demodulator 24 is coupled to a decoder/controller module 26 where bit errors are detected and forward error correction is applied to the demodulated signal. A decoded and corrected signal is generated and sent for voice processing in the base station controller 16. The decoder/controller module 26 also provides high level control and system management for the base station circuitry.

As previously indicated, the voice signal (having originated from a particular, connected mobile unit) is linked to the public telephone system 18 for connection to any other phone or mobile unit. Return voice signals from the connected phone are processed by base station transmission circuitry (not shown) for transmission to the originally connected mobile unit.

Transmitted signals are encoded to increase message reliability preferably with the use of an outer code for error detection and an inner code for error correction. The inner code is preferably an error correcting block code and the outer code is preferably an error detecting cyclic redundancy code (CRC). The preferred block code is the Reed-Solomon (R-S) code. After demodulation, received signals are sent for R-S decoding with error detection provided by the CRC.

INVENTION OVERVIEW-MESSAGE TRANSMISSION AND DECODING PROCESS IN DIGITAL CELLULAR COMMUNICATION SYSTEM

The present invention has application to cellular systems when both an outer error detection scheme and an inner error correction scheme are employed to provide code protection for transmitted messages. Further, the inner error correction scheme needs to have the capability of developing a collection of transmitted code word estimates, preferably ranked from best estimate to worst estimate.

Generally, an inner error correction decoder produces a list of estimates of the transmitted code word. This list may be ordered from the most likely candidate to the least likely candidate. For Reed-Solomon decoders, this list is generated by moving some number of erasure locations preferably from the most likely symbol error positions to less likely error positions. For Trellis codes, the ordered list is similarly developed by generating code words for the most likely path to less likely paths.

Once the ranked word estimate list is generated, the outer error detection decoder is applied to the list of transmitted code word estimates, beginning with the most likely word estimate. If the outer error detector finds a code word estimate without an error, that code word estimate is declared to be correct. If all code word estimates are found to be in error, a word error is declared.

As shown in FIG. 3A, an overall message transmitting and decoding procedure 30 starts with a data input 29 in the form of a digital data word. Generally, sequentially input data words represent an analog waveform corresponding to voice or other sound to be transmitted by the mobile unit.

Outer CRC coding is first applied to the data word as indicated by a block 31. A resulting encoded message 32 is applied as an input to a block 33 that employs an inner trellis encoding scheme or, as preferred in the present embodiment, a block encoding scheme.

An output channel code word 34 is generated by the encode block 33. With the preferred R-S block coding, data and parity bits are separately grouped in the channel code word 34. With trellis coding, the channel code word structure is not systematic, i.e. data bits are encoded into a code word in which the bits have no direct correspondence to the original data bits.

The channel code word is then transmitted over the transmission channel as indicated by a block 35. The received channel code word, indicated by a block 36, may be the same as the transmitted word or, if channel error has been introduced, it will differ from the transmitted word in accordance with the error.

Next, trellis or block decoding, preferably R-S block decoding, is performed as indicated by a block 37 to generate decoded message estimates $\hat{C}_1$ through $\hat{C}_e$ as indicated by a block listing 38. Finally, a CRC check is made as indicated by a block 39 on successive message estimates, and an accepted word estimate is generated as indicated by a block 40 when one of the word estimates checks error-free. If no word estimate checks error-free, the message is discarded as indicated by a block 42.

DECODER

The decoding means 26, includes a digital signal processor (DSP) 41 for R-S symbol assembly and decoding as shown in FIG. 3B. A soft bit output 43 is applied from the demodulator module 24 to the input of the decoder processor 41, and it is also applied to a bit generator 45 that generates a hard bit for each soft bit. The hard bit output is also applied to the input of the processor 41.

The hard bit output 45 defines each message bit as a 1 or a 0 with some probability of error. The soft bit output 43 defines each message bit with a value in a predetermined scale of values between −1 and +1 thereby indicating the relative reliability of the valuation of each message bit. If the soft bit value is positive, it is interpreted to be a hard 1 bit. If the soft bit value is negative, it is interpreted to be a hard 0 bit.

The decoding means 26 operates under program control and in accordance with the invention to decode each R-S encoded message word with improved performance, i.e., higher message reliability with better product cost effectiveness.

ENCODED WORD STRUCTURE

As previously indicated, inner and outer coding is used in cellular systems when transmitting data across a data channel so that the reliability of received data can be improved through error correcting and detecting processes. The R-S block coding is preferred for use in this embodiment because it is very effective where burst errors are commonly encountered, as is the case in cellular systems.

Generally, as practiced in the prior art, R-S coded messages can be decoded accurately, i.e., can have errors corrected, when a number e of symbol errors in unknown bit positions does not exceed a specific determinable value. In addition, R-S coded messages can be decoded correctly in the prior art when 2e symbol errors exist in known bit locations. As will become more evident hereinafter, the present invention provides an improvement over the prior art through extended error correcting capability in the decoding process.

Figure 8:
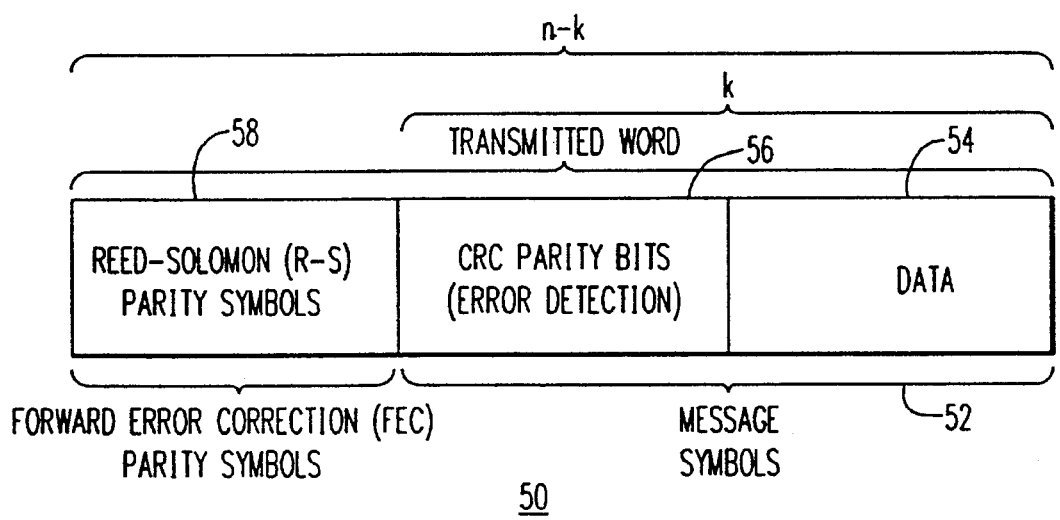
FIG. 8 graphically represents a transmitted data word.

In FIG. 8, there is shown a graphical representation 50 of the transmitted word structure for an R-S encoded message. A message portion 52 of the word 50 includes a data section 54 in which a predetermined number of symbols carry digital message data.

If the received symbols are the same as the transmitted symbols in the data section 54, the transmission has been executed with complete accuracy. An outer parity check code, preferably in the form of a cyclic redundancy check (CRC) code, is employed in a CRC code section 56 of the word message portion 52 to code the message data. The CRC code operates as an error detector and generates a flag if an error is detected in a transmitted message.

If an error is detected, retransmission may occur until no CRC error flag occurs and the message is accepted. As more fully described subsequently herein, an inner R-S forward error correction (FEC) code in an FEC word portion 58 encodes the message formed by the message data and the CRC. The FEC code operates with the error detection code (CRC) in accordance with the invention to reduce significantly the retransmission rate in cellular systems and thereby improve cellular communication reliability.

Figure 9:
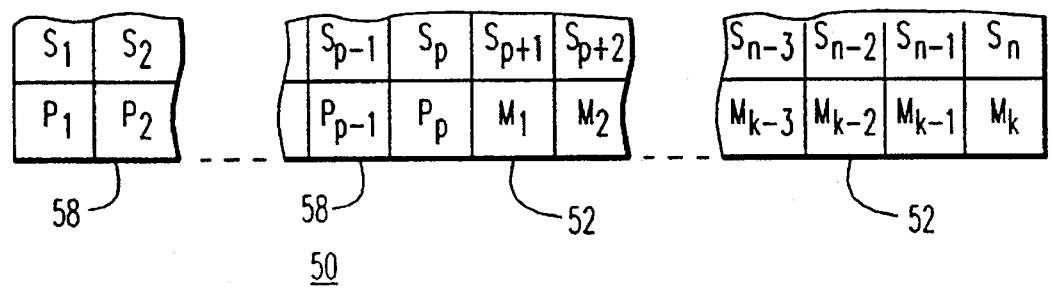
FIG. 9 details a Reed-Solomon coding scheme used for the data word of FIG. 8 with n word symbols, p parity symbols, and k message symbols.

The structure of the inner R-S coding is illustrated in FIG. 9. In the general case, a transmitted word 50 consists of n symbols S. The message portion 52 of the word 50 has k symbols S and the FEC word portion 58 has n–k or p symbols S for implementation of the R-S coding. An R-S decoder is known to be capable of correcting up to $$\frac{n-k}{2}$$

errors or [n–k] erasures.

DECODING PROCEDURE FOR THE INVENTION

Figure 4:
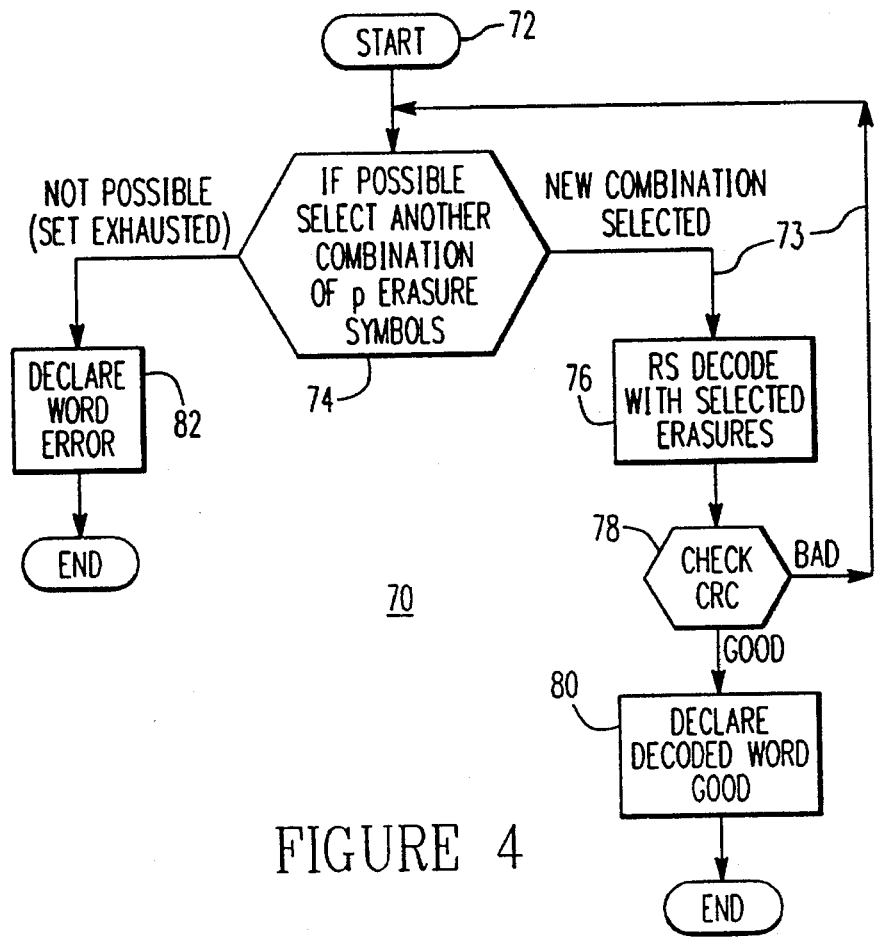
FIG. 4 shows a general flow chart for a decoding procedure employed in the decoder of FIG. 3 in accordance with the present invention.

A decoding procedure 70 shown in FIG. 4 is executed in the DSP 41 and operates with the preferred R-S coding scheme and is structured in accordance with the invention to provide improved cellular receiver or base station operation and other improvements in cellular communication systems. The procedure 70 is executed for each transmitted code word received by the receiver, i.e. the base station receiver in the preferred embodiment.

Generally, in accordance with the invention, a list of estimates is made for the transmitted code word, and a search is made during inner code processing through all or some of the transmitted word estimates, i.e. words with different symbol erasure combinations. The outer CRC decoding procedure is used to detect properly decoded messages. In effect, the random error correction capability for transmitted code words can be doubled with use of the invention. Furthermore, when reliability information is available for the received symbols, a limited search can be employed to reduce the computational load on the decoder and thereby reduce the risk that the CRC will fail to detect an erroneously decoded message.

Startup for the procedure 70 occurs in a block 72 and a program loop 73 makes a symbol error search for the current word. In one of the preferred embodiments of the invention, an entry selector block 74 selects all possible combinations of message data symbol erasures in the word for error testing in successive iterations of the program loop 73. Thus, a full search is made for all possible combinations of p erasure positions out of n symbols.

The full search cna involve up to $$\binom{n}{p}$$

combinations. Since the CRC detects all Reed-Solomon decoded message errors, all received words with p or fewer randomly occurring symbol errors will be correctly decoded.

For example, an R-S code may have a total number n of symbols equal to 10 of which 8 may be the number k information symbols. Therefore, in this example, there are a number p of parity symbols equal to 2. Decoding with a (10,8) R-S code can thus be performed successfully for 2 or fewer erasures. Under prior art procedures, only p/2 or 1 random error may be corrected with R-S decoding. With the use of searching in accordance with the present invention, a search is made of all or some of the possible erasure combinations which number $$\binom{10}{2}$$

or 45. As a result, the present invention enables correction of 2 random errors in the example of a (10,8) R-S code.

In the limited search, a subset of the R-S symbols are searched where the number n' of symbols searches is less than the total number n of symbols. The subset symbols are preferably selected on the basis of reliability information as more fully described subsequently herein.

As an example of a limited search executed in accordance with the invention, a (15,11) R-S code corrects up to four erased symbols. A complete search in accordance with the invention requires decoding of $$\binom{15}{4}$$

or 1365 erasure quadruplet combinations. If this is narrowed to the 8 least reliable symbols, a limited search in accordance with the invention requires decoding of $$\binom{8}{4}$$

or 70 erasure quadruplet combinations. Thus, significant computer load reduction may be achieved with the use of a limited search where a slight reduction in decoder performance is acceptable.

For each selection of data symbol erasures, the digital data for the selected symbols is switched to the opposite binary value and a block 76 decodes the modified word in accordance with an R-S decoding procedure. Another test block 78 checks the decoded message by means of a CRC check, and the decoded word is declared error-free for further processing in a block 80 if the CRC check detects no error.

In that event, the message data in the modified word having CRC verification is determined to be true to the transmitted message data and the modified word is accepted as a corrected word. A forward error correction has thus been made.

However, if the CRC check finds an error in the message data in the modified word, an indication is made that the erased symbols did not include all of the error symbols and thus did not correct the message data error(s). The program loop 73 then returns to the test block 74 for another iteration with the next possible symbol erasure combination.

Loop iterations are repeated until the test block 78 provides an error-free check or until the test block 74 has processed all possible symbol erasure combinations.

When a search has been exhausted without discovery of symbol errors, a block 82 declares the word to have an uncorrectable error, and the uncorrected word is processed for retransmission or abandonment in accordance with system procedural requirements. A failure may occur, for example, if the number of symbol errors exceeds p.

REED-SOLOMON ENCODING AND DECODING—BACKGROUND INFORMATION

Generally, R-S codes are a class of linear block codes with the following properties:
1) non-binary (q element alphabet)
2) cyclic
3) can correct y errors in unknown positions and z errors in known positions as long as:

$$2y_n + z > n-k$$

where: n is the number of symbols in the code word, k is the number of data symbols in the code word, and n−k=p is the number of parity symbols in the code word.

Code words for linear block codes are generated by augmenting k data symbols with p parity symbols. The resulting code word has n symbols. Reed-Solomon codes are non-binary. Each symbol within a code word can take on any one of q values. R-S codes are cyclic codes. That is, if:

$(S_0, S_1, S_2, \ldots, S_{n-1})$ is a legitimate code word, then so are:

$(S_1, S_2, S_3, \ldots, S_{n-1}, S_0)$, $(S_2, S_3, S_4, \ldots, S_0, S_1)$, etc.

Cyclic codes with symbols that come from a q element alphabet are based on Galois fields. The multiplication and addition operations for the elements or symbols are defined by the Galois field and in turn the Galois fields are defined by an irreducible polynomial G(x).

The first step in defining an R-S code is to define what is meant by addition and multiplication of elements (symbols). An R-S code is then fully defined by the selection of a generator polynomial. Although many more generator polynomials can be found, one can be selected for a particular n−k as follows:

$$\Theta(x) = \prod_{i=1}^{n-k} (x - \alpha i)$$

A number of decoding schemes have been developed that exploit the field characteristics of R-S codes. Both time domain and transform domain algorithms have been used. Typical prior art algorithms find the closest code word to the received code word (the code word that differs from the received word by the fewest number of symbols) without exhaustively searching all code word possibilities. The total number of code words is $$q^k$$

Erasures can also be introduced in prior art R-S decoding algorithms. Such algorithms then find the code word that differs from the received word by the least number of symbols, excluding the erasure locations.

In typical prior art calculating procedures for R-S decoding, the bit position from right to left is defined by x to the power that corresponds in number to the bit position. A locator polynomial is solved for roots to get bit positions, and an evaluator polynomial uses the roots to get the magnitude at the root locations.

Message encoding employs two steps. The data is first encoded using a CRC, then the message (CRC parity bits and data) is coded using a Reed-Solomon code. To decode the received word, Reed-Solomon decoding is used to eliminate as many errors as possible. If message errors still exist, they are detected by the CRC and the received message is discarded. This prior art approach normally successfully decodes received messages with $$\frac{[n-k]}{2}$$

errors in unknown locations.

INVENTION DECODING PROCEDURES—GREATER DETAIL

Figure 5A:
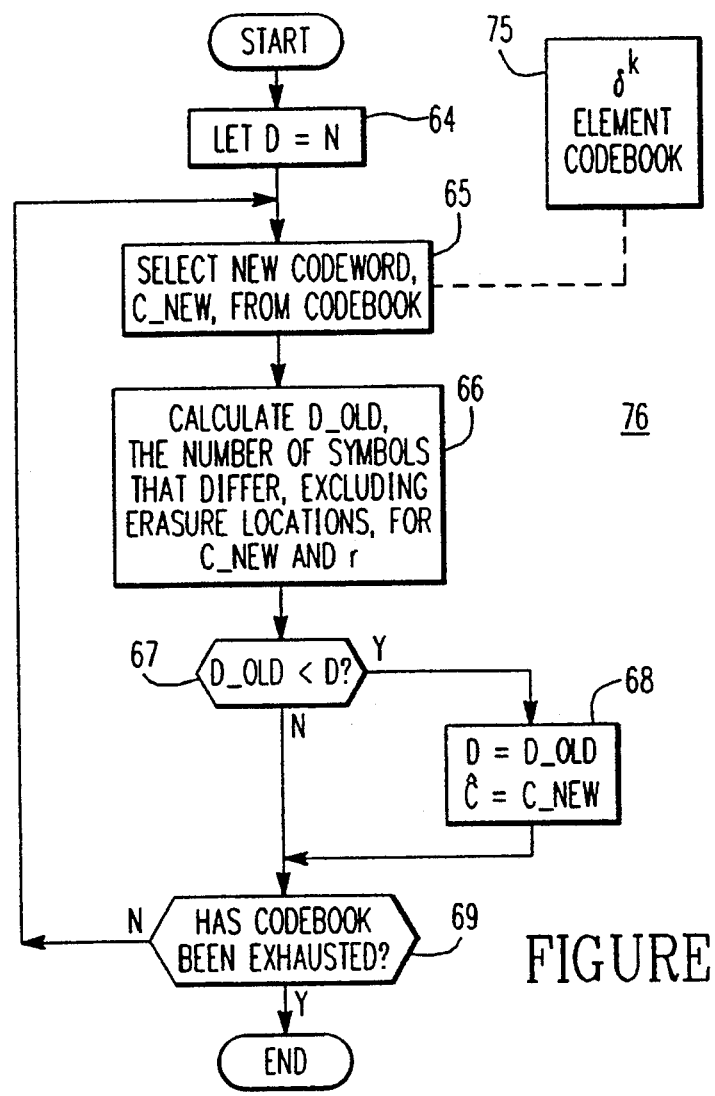
FIG. 5A shows with greater detail Reed-Solomon decoding as employed in FIG. 4 in accordance with the present invention.

With reference to the R-S decoding block 76 in FIG. 4 and FIG. 5A, it is well known that a Reed-Solomon coded message can be accurately decoded when $2T+E \leq d-1$ where:

d is the minimum distance between code words,

T is the number of errors in unknown symbol locations (symbol errors),

E is the number of symbol locations known to be unreliable (symbol erasures).

The maximum number of errors in unknown locations that can be corrected is $$\frac{\lfloor d-1 \rfloor}{2}.$$

In accordance with the present invention, all or some of the erasure assignment combinations of d−1 symbol positions are searched. Therefore, if the CRC successfully determines whether a decoded word is correct, n (d−1) randomly occurring errors can be corrected with use of the invention.

The R-S decoder 76 is shown in greater detail in FIG. 5A.

Figure 10:
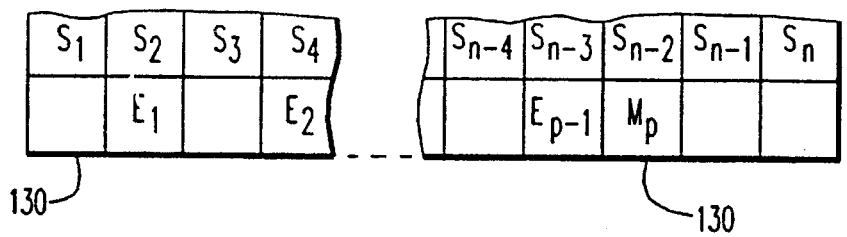
FIG. 10 illustrates a typical assignment of bit erasures by the selector of FIG. 5B to an n symbol word.

A typical assignment of p erasures to an n symbol word is shown in FIG. 10.

In the process of choosing erasures for a limited search, n−k erasures are picked out of n symbol locations by making use of symbol reliability information. Let:

$(SR_1, SR_2, \ldots SR_n)$ represent the reliability of each symbol. Symbol reliability is determined from the reliability of input signal bits, i.e. from the soft bit values for hard bits in each symbol. For a full search, no reliability information need be used in selecting erasure locations since all possible assignments of n−k erasures to n positions are tried.

The number of combinations is given by $$\binom{n}{n-k} = \frac{n!}{(n-k)!(n-(n-k))!} = \frac{n!}{(n-k)!\,k!}$$

In a partial search, the n' least reliable positions are chosen out of n positions for the search. The number of combinations in a partial search is given by:

$$\binom{n'}{n-k} = \frac{n'!}{(n-k)!(n'-(n-k))!}$$

Symbol reliability information may be used to select some subset of received symbols for the erasure search. Thus, the n' (n'<n) least reliable symbols are selected as possible erasures. The $$\binom{n'}{p}$$

combinations of erasures is then searched to find a decoded message that passes the CRC test. With use of the reliability based search, fewer computations are required and fewer chances occur for the CRC to be penetrated. If the symbol reliability information is good, most (but necessarily not all) received words with p or fewer errors are corrected.

Figure 5B:
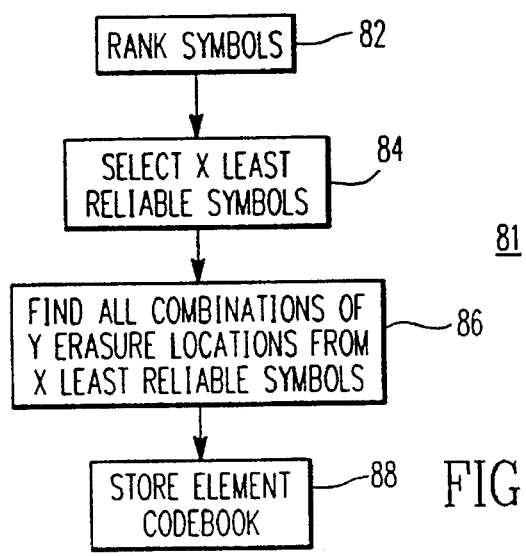
FIG. 5B provides greater detail for a symbol erasure selector employed in the flow chart of FIG. 4.

More particularly, as shown for the preferred embodiment in FIG. 5B, a partial-search codebook for each successive message word is created in accordance with a logic flow diagram routine 81. In a block 82, symbols in the word are ranked preferably from least reliable to most reliable.

Next, a predetermined number x of least reliable symbols are selected for error searching in a block 84. A listing is then made in a block 86 of all combinations of a preselected number of erasure locations y for the x least reliable symbols, and the listing is stored as the codebook for the current message word as indicated by block 88.

Generally, in accordance with CRC encoding, D data bits can be protected with P parity bits as follows:

$$d(x) = d_{D-1}x^{D-1} + d_{D-2}x^{D-2}, \ldots \quad \text{DATA}$$
$$(d_{D-1}, d_{D-2}, \ldots d_0)$$

$$b(x) = b_{D+P-1}x^{D+P-1} + \ldots \quad \text{MESSAGE}$$
$$(b_{D+P-1}, b_{D+P-2}, \ldots b_0)$$

$$g(x) = g_P x^P + g_{P-1}x^{P-1} + \ldots \quad \text{GENERATOR}$$
$$g_1 x + 1 \quad \text{POLYNOMIAL}$$

$$R(x) = \text{remainder of } \frac{x^P d(x)}{x\,g(x)} = R_{P-1}x^{P-1} \ldots + R_0$$
$$(R_{P-1}, R_{P-2}, \ldots R_0) \quad \text{REMAINDER}$$

Figure 6A:
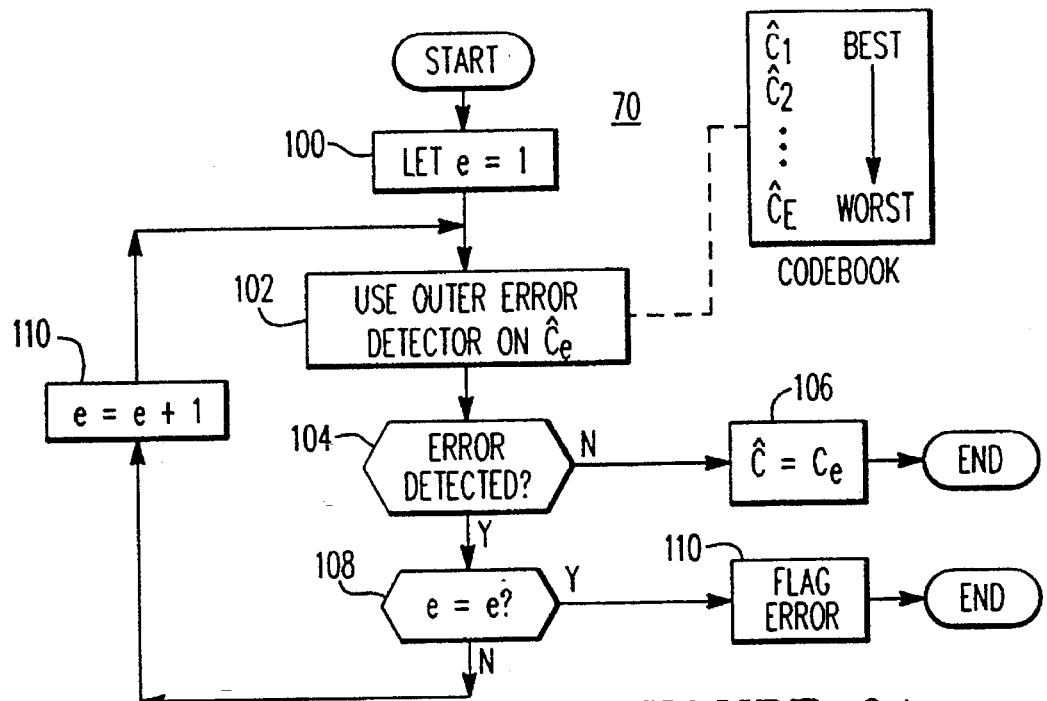
FIGS. 6A and 6B provide more detailed flow charting for CRC checking employed in the procedure of FIG. 4.
Figure 6B:
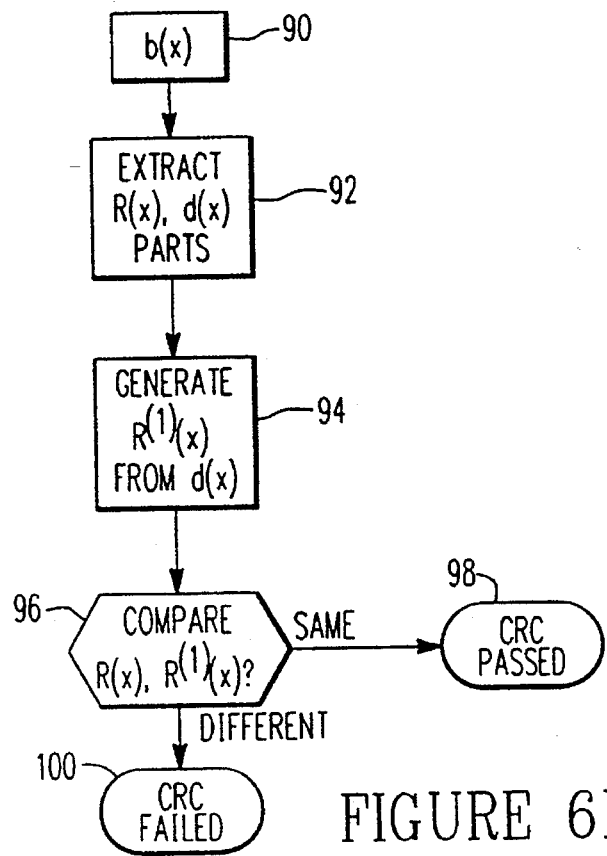

In decoding, a CRC check is generally made as follows:

b(x), indicated by block 90 in FIG. 6B, represents the received message.

d(x), representing the data portion of the message and R(x) representing the parity portion of the message are separated as indicated by block 92. That is:

$$b(x) = b_{D+P-1}x^{D+P-1} + b_{D+P-2}x^{D+P-2} + b_1 x + b_0$$
$$= R_{P-1}x^{D+P-1} + R_{P-2}x^{D+P-2} + \ldots +$$
$$R_0 x^D + d_{D-1}x^{D-1} + \ldots + d_0$$

Next, block 94 generates $$R^{(1)}(x) = \text{remainder } \frac{X^P}{g} \frac{d(x)}{(x)}.$$

Then, as indicated by blocks 96 and 98 if:

$$R^1(x) = R(x), \text{ i.e. } R_{P-1} = R^{(1)}_{P-1} \text{ and } R_{P-1} = R^{(1)}_{P-1}\ldots,$$

then the received message passes the CRC check. Otherwise, it fails as indicated by blocks 96 and 100.

Accordingly, in the procedure 70 of FIG. 4, the CRC check block 78 operates as more fully shown in FIG. 6A. After startup, a counter e for code words with different erasures is set equal to 1 in a block 100. Next, the CRC outer error detector is applied to $\hat{C}_e$ in a block 102, and a test block 104 checks the results to determine whether an error has been detected.

If there is no error, a block 106 sets $\hat{C}$ equal to $\hat{C}_e$ as the corrected message word for further processing. Otherwise, a test block 108 returns the program flow to a block 110 that advances the e counter for a repeat execution of the block 102 for the next code word in the codebook 75 (FIG. 5A). If the code word $\hat{C}_e$ is reached in the search without finding an error-free code word, the block 108 flags an error as indicated by a block 110. The current message word is then trashed, and a retransmission of that word may be initiated.

In generating R-S symbols from soft decision information and in defining R-S symbol reliability, the demodulator 26 generates a stream of soft-decision values with each value corresponding to a bit that has been transmitted across the channel. For an m bit per symbol R-S code, an R-S symbol number and an R-S symbol reliability number are assigned to each m soft-decision block.

Figure 7:
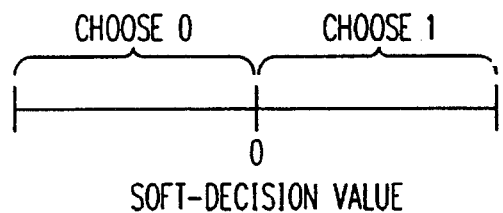
FIG. 7 illustrates a routine employed in the procedure of FIG. 4 to determine Reed-Solomon symbol reliability values from soft decision data bits generated by a demodulator module in the base station circuitry of FIG. 2.

To generate an R-S symbol from m soft-decision values, the format shown in FIG. 7 is assumed for soft-decision values. If a soft-decision value is positive, a hard-decision value of 1 is chosen. If the soft decision value is negative, a hard-decision value of 0 is chosen. To generate an R-S symbol, ($RS_1$, $RS_2$, $RS_3$. . . $RS_m$), from m soft-decision values, ($SD_1$, $SD_2$, $SD_3$. . . $SD_m$), the following rule is used:

The reliability (SR) of the resulting symbol is given by $$SR = \min \{SD_i\}$$
$$i = 1, 2 \ldots n$$

An R-S symbol is more reliable with larger values of the reliability SR.

COMPARATIVE PERFORMANCE OF INVENTION OVER PRIOR ART

The present invention addresses the need to transmit control signals reliably across a radio interface. It is particularly applicable in the case where the channel can be modeled as Rayleigh fading since the preferred underlying R-S coding scheme is particularly well suited for burst-error correction. For an extended time division multiple access application, reliable transmission of control signals is critical since the acceptance of erroneous messages can result in radio telephone disconnects and possibly more disruptive consequences.

For the preferred embodiment, and other invention applications where some form of message retransmission is possible when a message error is detected, there are two performance criteria to be minimized:

Retransmission Rate—the probability of a message error after Reed-Solomon decoding.

CRC Penetration Rate—the probability that the CRC will pass a Reed-Solomon decoded message which contains errors.

Minimizing the retransmission rate implies maximizing the error correction capabilities of the R-S code. The CRC penetration rate depends on the error detection capabilities of the Reed-Solomon code. The CRC penetration rate depends on the error detection capabilities of the CRC and the number of times the CRC must be exercised.

Several prior art schemes have been proposed to make use of soft decision information in the assignment of erasures or well documented in various textbooks. The prior art schemes rely on the selection of a specific set of erasure locations and provide no guarantee that the number of correctable errors will exceed or equal the random error correcting limit of $$\left\lfloor \frac{d-1}{2} \right\rfloor.$$

In accordance with the present invention a searching of all or some of the d−1 erasure position combinations combined with the use of an outer CRC enable the random error correcting limit of d−1 errors to be achieved and generally provide improved decoding performance.

Figure 11:
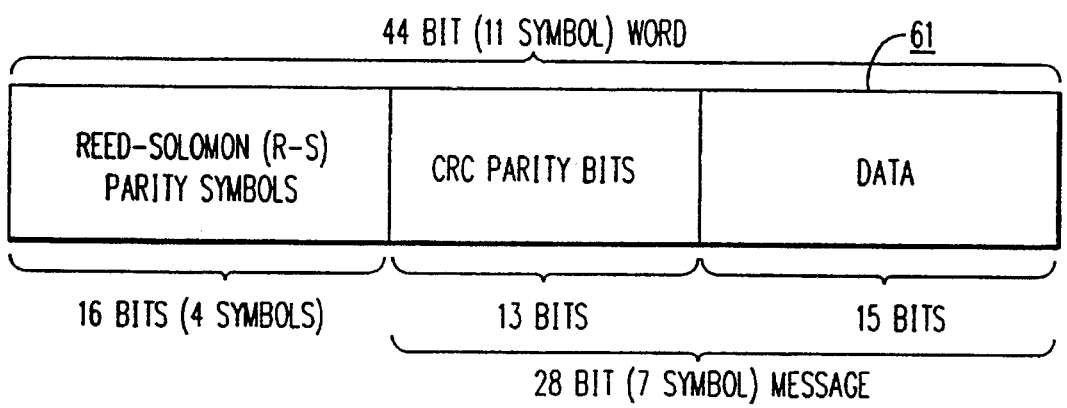
FIG. 11 shows a typical prior art bit structure for a transmitted word in a typical prior art cellular system employing Reed-Solomon decoding.
Figure 12:
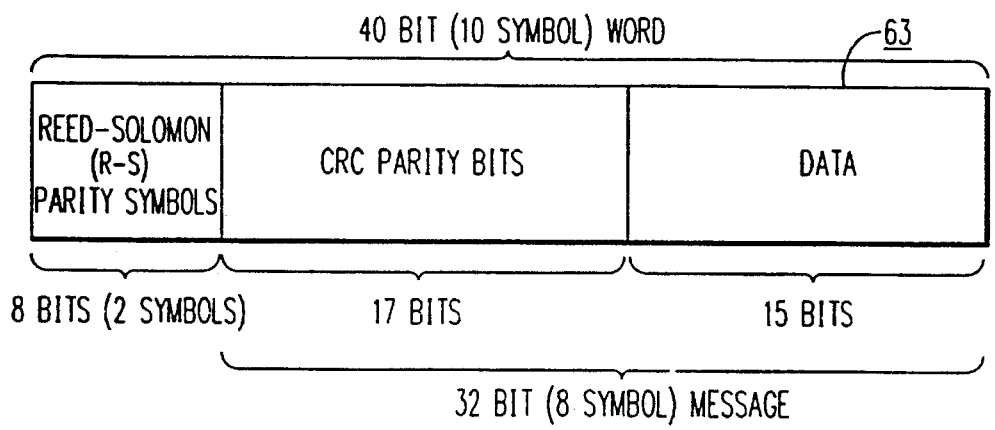
FIG. 12 comparatively shows a bit structure for a transmitted word in a cellular system having a base station that provides decoding in the preferred embodiment in accordance with the present invention.

To show the superior performance of the invention an example of the invention (FIG. 12) is compared to a prior art example (FIG. 11). The prior art example has a double symbol error correcting R-S code, a 13 bit CRC, and a 15 bit data word. The CRC is a shortened (63, 50) BCH code with a minimum distance of 6. The total number of transmitted word bits is 44. The invention example employs a single error correcting R-S outer code, a 17 bit inner CRC code and 15 bits of data. The CRC is a shortened (63, 46) BCH code with a minimum distance of 7. The longer CRC code was chosen for the invention example because searches through erasures makes CRC penetrations more likely. The single error correcting R-S code used in the double erasure correcting mode, corrects all or most double errors.

Although the invention example requires the transmission of fewer bits (40 instead of 44), it provides comparable error correcting capabilities (comparable retransmission rates) while the number of CRC penetrations is reduced.

The prior art example and the invention were tested by simulating the transmission of 100,000 words. The channel was simulated using an error mask consistent with that used by the Telecommunications Industry Association (TIA) for IS-54 voice transmission. It represents the effects of Rayleigh fading for a vehicle speed of 30 mph at low signal-to-noise ratios of 6 dB and 11 dB (channel BERs of 16% and 7%) when $$\frac{\pi}{4} -$$

Shifted Differential QPSK is used at 900 MHz.

Results

The 3 strategies are compared in Table 1: the prior art, the invention with a full search, and the invention with a partial search.

TABLE 1

|  | 6 dB | | 11 dB | |
| --- | --- | --- | --- | --- |
|  | Retransmission Rate | CRC Penetrations | Retransmissions Rate | CRC Penetrations |
| Prior Art | 62% | 6 | 27% | 6 |
| Full Search | 60% | 6 | 26% | 7 |
| Partial Search | 63% | 0 | 27% | 2 |

The present invention doubles the number of random errors that can be corrected when compared to typical R-S decoding schemes and thereby enables radio link transmission to have required throughput by reducing the number of retransmissions.

Prior Art—44 total transmitted bits per word (15 data bits, 13 CRC bits, 16 R-S bits)

Invention, Full Search—40 total transmitted bits per word (15 data bits, 17 CRC bits, 8 Reed-Solomon bits), full search of all 45 erasure symbol pairs out from the 10 symbol received word.

Invention, Partial Search—40 transmitted bits per word (15 data bits, 17 CRC bits, 8 Reed-Solomon bits), search of erasure symbol pairs from the 5 least reliable received symbols (10 pairs searched).

The invention provides superior performance over the prior art with reduced CRC penetration rates at the same retransmission rate even when fewer transmitted bits are used.

The foregoing description of the preferred embodiment has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

What is claimed is:

1. A receiver in a wireless radio communication system comprising:

means for receiving and demodulating a transmitted signal representing a code word containing a message encoded in an outer code with an error detecting code and encoded in an inner code with an error correcting Reed-Solomon code;

means for decoding the demodulated signal including;

means for generating a list of estimates of the code word from the demodulated signal;

means for operating an error correcting decoder with the error correcting Reed-Solomon code to decode estimates of the code word;

means for operating an error detecting decoder with the error detecting code to process decoded code word estimates and determine whether an error exists in each decoded code word estimate that is processed;

means for generating as an output signal any decoded code word estimate detected to be error-free; and means for generating a code word error if no decoded code word estimate is detected to be error-free.

2. A base station having the receiver of claim 1 and further including:

means for coupling receiver output signals to a public telephone system.

3. The receiver of claim 1 wherein each code word has a predetermined number p of symbols and a predetermined number n of symbol positions are selected for erasure, the list of code word estimates is formed from all possible symbol erasure combinations, and the code word estimates are processed by the error detecting means in a predetermined order until an error-free code word estimate is found or until all code word estimates have been processed and no error-free code word estimate is found.

4. The receiver of claim 1 further including means for processing digital signals, the digital signal processing means including the operating means and the generating means.

5. The receiver of claim 1 wherein the error detecting code is a cyclic redundancy code.

6. The cellular receiver of claim 1 wherein each code word has a predetermined number p of symbols and a predetermined number n of symbol positions are selected for erasure and wherein:

means are provided for determining the reliability of each code word symbol and for selecting those symbols for erasure that have a reliability below a predetermined level;

the list of code word estimates is formed from all possible erasure combinations of the selected less reliable symbols; and the code word estimates are processed by the error detecting means in a predetermined order until an error-free code word estimate is found or until all code word estimates have been processed and no error-free code word estimate is found.

7. The receiver of claim 6 wherein the predetermined order for processing the code word estimates is in reliability order from the least reliable estimate to the most reliable estimate.

8. The receiver of claim 6 wherein the reliability determining means includes:

means for generating hard bit values from soft bit values derived from the transmitted signal; and means for generating symbol reliability values from the soft and hard bit values.

9. The receiver of claim 7 further including means for processing digital signals, the digital signal processing means including the operating means, the generating means and the reliability determining means.

10. A method for operating a receiver in a cellular communication system, the steps of the method comprising:

receiving and demodulating a transmitted signal representing a code word containing a message encoded in an outer code with an error detecting code and encoded in an inner code with an error correcting Reed-Solomon code;

decoding the demodulated signal including the substeps of:

generating a list of estimates of the code word from the demodulated signal;

operating an error correcting decoder with the error correcting Reed-Solomon linear block code to decode estimates of the code word;

operating an error detecting decoder with the error detecting code to process decoded code word estimates and determine whether an error exists in each decoded code word estimate that is processed;

generating as an output signal any decoded code word estimate detected to be error-free; and generating a code word error if no decoded code word estimate is detected to be error-free.

11. The method of claim 10 wherein each code word has a predetermined number p of symbols and a predetermined number n of symbol positions are selected for erasure, the list of code word estimates is formed from all possible symbol erasure combinations, and the step of operating an error detecting decoder comprises processing the code word estimates in a predetermined order until an error-free code word estimate is found or until all code word estimates have been processed and no error-free code word estimate is found.

12. The method of claim 10 wherein the error detecting code is a cyclic redundancy code.

13. The method of claim 10 wherein each code word has a predetermined number p of symbols and a predetermined number n of symbol positions are selected for erasure, further comprising the steps of:

determining the reliability of each code word symbol and selecting those symbols for erasure that have a reliability below a predetermined level;

forming the list of code word estimates from all possible erasure combinations of the selected less reliable symbols; and processing the code word estimates in the step of operating an error detecting decoder in a predetermined order until an error-free code word estimate is found or until all code word estimates have been processed and no error-free code word estimate is found.

14. The method of claim 13 wherein the predetermined order for processing the code word estimates is in reliability order from the least reliable estimate to the most reliable estimate.

15. The method of claim 13 wherein the step of determining the reliability includes:

generating hard bit values from soft bit values derived from the transmitted signal; and generating symbol reliability values from the soft and hard bit values.

16. A receiver in a communication system comprising:

a demodulator receiving and demodulating a transmitted signal representing a code word containing a message encoded in an outer code with an error detecting code and encoded in an inner code with an error correcting Reed-Solomon code;

means for decoding the demodulated signal including;

a code word estimator for generating a list of estimates of the code word from the demodulated signal;

an error correcting decoder applying the error correcting Reed-Solomon code for decoding estimates of the code word;

an error detecting decoder applying the error detecting code for processing decoded code word estimates and determining whether an error exists in each decoder code word estimate that is processed;

a port for producing as an output signal any decoded code word estimate detected to be error-free;

an error flag generator coupled to the error detecting decoder for generating a code word error if no decoded code word estimate is detected to be error-free.

17. The receiver of claim 16 wherein each code word has a predetermined number p of symbols and a predetermined number n of symbol positions are selected for erasure, the list of code word estimates is formed from all possible symbol erasure combinations, and the code word estimates are processed by the error detecting decoder in a predetermined order until an error-free code word estimate is found or until an error-free code word estimate is found or until all code word estimates have been processed and no error-free code word estimate is found.

18. The receiver of claim 16 comprising a digital signal processor, the digital signal processor being comprised of the error correcting decoder, the error detecting decoder, and the error flag generator.

19. The receiver of claim 16 wherein the error detecting code is a cyclic redundancy code.

20. The receiver of claim 16 wherein each code word has a predetermined number p of symbols and a predetermined number n of symbol positions are selected for erasure and wherein:

the error detecting decoder comprises means for determining the reliability of each code word symbol and for selecting those symbols for erasure that have a reliability below a predetermined level;

wherein the code word estimator forms the list of code word estimates from all possible erasure combinations of the selected less reliable symbols; and wherein the error detecting decoder processes the code word estimates in a predetermined order until an error-free code word estimate is found or until all code word estimates have been processed and no error-free code word estimate is found.

21. The receiver of claim 20 wherein the predetermined order for processing the code word estimates is in reliability order from the least reliable estimate to the most reliable estimate.

22. The receiver of claim 20 wherein the reliability determining means includes:

means for generating hard bit values from soft bit values derived from the transmitted signal; and means for generating symbol reliability values from the soft and hard bit values.

* * * * *